United States Patent
Ray et al.

(10) Patent No.: US 9,300,092 B1
(45) Date of Patent: Mar. 29, 2016

(54) HIGH FREQUENCY RJ45 PLUG WITH NON-CONTINUOUS GROUND PLANES FOR CROSS TALK CONTROL

(71) Applicant: Optical Cable Corporation, Roanoke, VA (US)

(72) Inventors: John Michael Ray, Asheville, NC (US); Derrick F. Stikeleather, Swannanoa, NC (US); Ian J. Timmins, Asheville, NC (US)

(73) Assignee: Optical Cable Corporation, Roanoke, VA (US)

( * ) Notice: Subject to any disclaimer, the term of this patent is extended or adjusted under 35 U.S.C. 154(b) by 0 days.

(21) Appl. No.: 14/598,793

(22) Filed: Jan. 16, 2015

Related U.S. Application Data (60) Provisional application No. 62/057,443, filed on Sep. 30, 2014.

(51) Int. Cl.
*H01R 12/00* (2006.01)
*H01R 13/6473* (2011.01)

(52) U.S. Cl.
CPC .................................. *H01R 13/6473* (2013.01)

(58) Field of Classification Search
CPC ........... H01R 13/6473; H01R 13/6469; H01R 13/6658; H01R 13/02
See application file for complete search history.

(56) References Cited

U.S. PATENT DOCUMENTS

| | | | |
|---|---|---|---|
| 5,299,956 A | 4/1994 | Brownell et al. | |
| 6,287,149 B1 | 9/2001 | Elkhatib et al. | |
| 6,808,399 B2 | 10/2004 | Rothermel et al. | |
| 7,102,463 B2 | 9/2006 | Clark | |
| 8,120,927 B2 | 2/2012 | Chen et al. | |
| 8,282,425 B2 * | 10/2012 | Bopp | H01R 13/6658 439/676 |
| 8,287,316 B2 * | 10/2012 | Pepe | H01R 13/02 439/676 |
| 8,435,082 B2 * | 5/2013 | Bopp | H01R 13/6469 439/676 |
| 2009/0269978 A1 | 10/2009 | Pepe et al. | |
| 2011/0300740 A1 | 12/2011 | Schumann et al. | |

(Continued)

OTHER PUBLICATIONS

International Application Division; Korean Intellectual Property Office; PCT Application No. PCT/US2015/051680; Jan. 6, 2016; International Search Report and Written Opinion of the International Searching Authority.

*Primary Examiner* — Jean F Duverne
(74) *Attorney, Agent, or Firm* — The Van Winkle Law Firm; David M. Carter; William G. Heedy (57) ABSTRACT

There is provided a communication connector including a housing and a plurality of electrical contacts received by the housing. A printed circuit board (PCB) is provided and includes at least first and second pairs of electrical conductive traces. The first pair of traces is connected to a first pair of contacts. The second pair of traces is connected to a second pair of contacts. The PCB has first and second regions. The first pair of contacts is located in the first region and the second pair of contacts is located in the second region. The PCB further includes at least a first ground plane. The first ground plane has first and second sections. The first and second sections are electrically isolated from one another. At least a portion of the first section being adjacent to at least a portion of the first pair of traces. At least a portion of the second section is adjacent to at least a portion of the second pair of traces whereby signal transmission is enhanced. A layer of dielectric material which has a relatively low dielectric constant is located between the first and second traces and the first ground plane.

20 Claims, 14 Drawing Sheets

(56) References Cited

U.S. PATENT DOCUMENTS

| | | |
|---|---|---|
| 2012/0111623 A1 | 5/2012 | Chen et al. |
| 2014/0154895 A1 | 6/2014 | Poulsen et al. |
| 2014/0203886 A1 | 7/2014 | Schumacher |
| 2014/0206240 A1 | 7/2014 | Schumacher et al. |

* cited by examiner

HIGH FREQUENCY RJ45 PLUG WITH NON-CONTINUOUS GROUND PLANES FOR CROSS TALK CONTROL

RELATED APPLICATION

This application claims priority to and incorporates entirely by reference U.S. Provisional Patent Application Ser. No. 62/057,443 filed on Sep. 30, 2014.

BACKGROUND OF THE INVENTION

This invention relates to reducing electrical signal interference and return loss which arises due to parallel contacts in electrical connectors. More particularly, it relates to reducing return loss and pair to pair as well as common mode cross talk interference in FCC type plugs. The Federal Communications Commission has adopted certain architectural standards with respect to electrical connectors utilized in the telecommunications industry so as to provide intermatability. The connectors most commonly utilized are FCC type modular plugs and jacks, also referred to as RJ45 plugs and jacks. The plug is commonly terminated to a plurality of conductors which may be connected to a communication device. Normally, each plug is terminated to eight conductors which form four pairs. The corresponding jack is commonly mounted to a panel or a printed circuit board or a wall outlet, which in turn is connected to the telecommunication network. To complete the circuit, the plug and jack are intermated.

While most of the cross talk and return loss problems arise in the plug, normally the reduction of cross talk and return loss is dealt with in the jack. For example, U.S. Pat. No. 5,299,956 assigned to Optical Cable Corporation, assignee of this application, shows a jack connected to a circuit board in which traces on the board are used to cancel cross talk which primarily arises in a corresponding plug. U.S. Pat. No. 5,310,363, also assigned to Optical Cable Corporation, shows a similar jack having both cross talk cancellation and return loss reduction features.

Industry standards for maximum cross talk, both near end cross talk (NEXT) and far end cross talk (FEXT), common mode coupling, and maximum return loss are governed by the Telecommunications Industry Association (TIA). The TIA is currently addressing performance standards at the so-called Category 8 level, which is in a bandwidth of up to 2,000 MHz and designed to enable data transmission rates up to 40 Gbits per second. The TIA standards are pair and frequency dependent. The TIA standards as currently drafted for NEXT, FEXT and return loss for various frequencies and pairs are shown in the graphs illustrated in FIGS. 6 through 14.

As previously stated and as taught in Optical Cable Corporation's U.S. Pat. No. 5,299,956, cross talk compensation is normally primarily carried out on a circuit board which is attached to the jack. A properly designed plug, however, is essential so as not to degrade the cross talk cancellation features of the jack and, in addition, to ensure minimal return loss.

SUMMARY OF THE INVENTION

In accordance with one form of this invention, there is provided a communication connector comprising a housing, a plurality of pairs of electrical contacts received by the house, and a printed circuit board (PCB). The PCB includes at least first and second pairs of electrical conductive signal traces. The first pair of traces is connected to a first pair of contacts. The second pair of traces is connected to a second pair of contacts. The PCB has first and second regions. The first pair of traces is located in the first region and the second pair of traces is located in the second region. The PCB further includes at least a first ground plane. The first ground plane has first and second sections. The first and second sections are substantially electrically isolated from one another. At least a portion of the first section is adjacent to at least a portion of the first pair of traces. At least a portion of the second section is adjacent to at least a portion of the second pair of traces whereby signal transmission performance is improved.

In accordance with another form of this invention, there is provided a communication connector comprising a housing, a plurality of pairs of electrical contacts received by the housing, and a printed circuit board (PCB). The PCB includes at least first and second pairs of electrically conductive signal traces. The first pair of traces is connected to a first pair of contacts. The second pair of traces is connected to a second pair of contacts. The PCB has first and second regions. At least one trace of the first pair of traces is located in the first region and at least one trace of the second pair of traces is located in the second region. The PCB further includes at least a first ground plane. The first ground plane has a gap thereby forming first and second sections which are not electrically connected to each other. At least a portion of the first section is adjacent to at least a portion of at least one trace of the first pair. At least a portion of the second section is adjacent to at least a portion of at least one trace of the second pair.

In accordance with yet another form of this invention, there is a provided a communication connector including a housing, a plurality of pairs of electrical contacts received by the housing, and a printed circuit board (PCB). The PCB includes at least first and second pairs of electrical conductive signal traces. The first pair of signal traces is connected to a first pair of contacts and the second pair of signal traces is connected to a second pair of contacts. The PCB further including a ground plane, a first dielectric layer having a first dielectric constant and a second dielectric layer having a dielectric constant lower than the dielectric constant of the first dielectric layer. The first dielectric layer is adjacent to one side of the ground plane and the second dielectric layer is adjacent to the other side of the ground plane and the second dielectric layer is also adjacent to the first and second pairs of signal traces. Preferably, ground plane coupling is primarily to the adjacent traces above it.

BRIEF DESCRIPTION OF THE DRAWINGS

The subject matter which is regarded as the invention is set forth in the appended claims. The invention itself together with further objects and advantages may be better understood in reference to the following description taken in conjunction with the accompanying drawings in which:

DESCRIPTION OF THE PREFERRED EMBODIMENT

Figure 1:
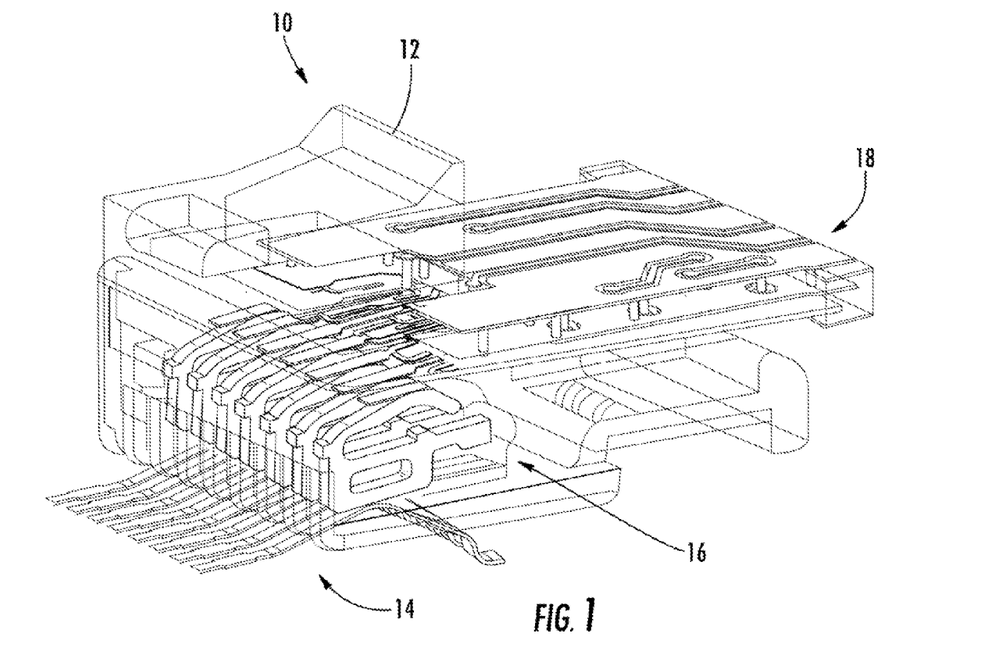
FIG. 1 is a cut-away partial pictorial view of the plug of the subject invention showing a circuit board and plug contacts interfacing with corresponding jack contacts.

Referring now more particularly to FIG. 1, there is provided plug 10 having plastic body 12. Preferably, plug 10 has the connection architecture of a standard FCC RJ45 plug for connecting four signal pairs of conductors to a corresponding RJ45 jack, which except for jack contacts 14, is not shown. Plug 10 includes eight contacts 16 which are ordered in pairs in accordance with FCC standards. According to the FCC standards, pair 1 consists of the fourth and fifth contacts, pair 2 consists of the first and second contacts, pair 3 consists of the third and sixth contacts, and pair 4 consists of the seventh and eighth contacts.

Figure 3:
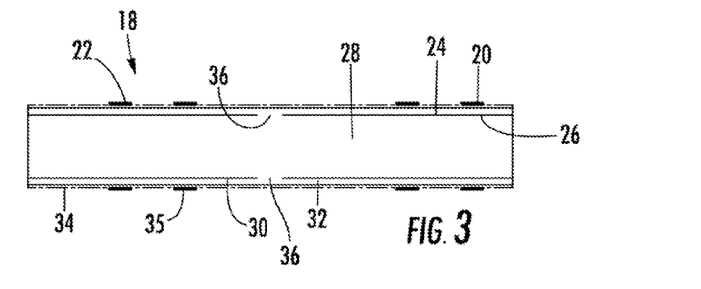
FIG. 3 is an inverted sectional view of the circuit board of FIG. 2 taken through section lines 3-3.
Figure 4:
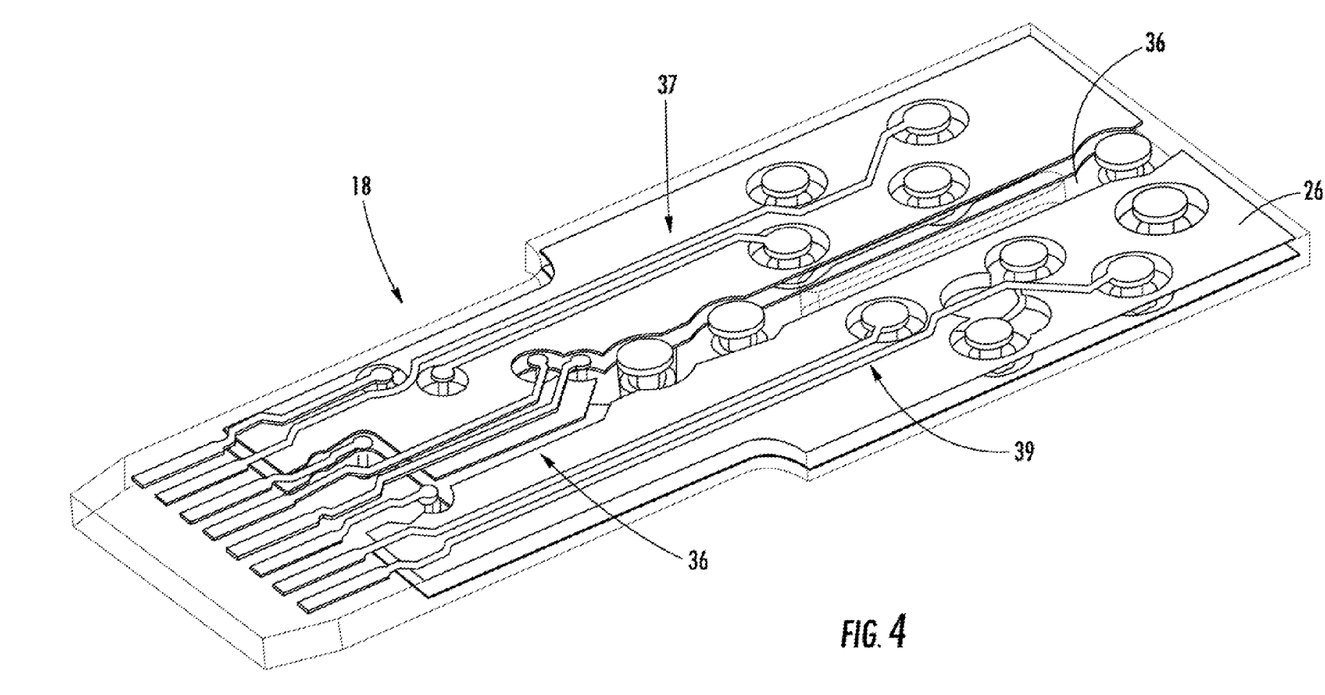
FIG. 4 is a pictorial view of the circuit board of FIGS. 1 and 2.
Figure 5:
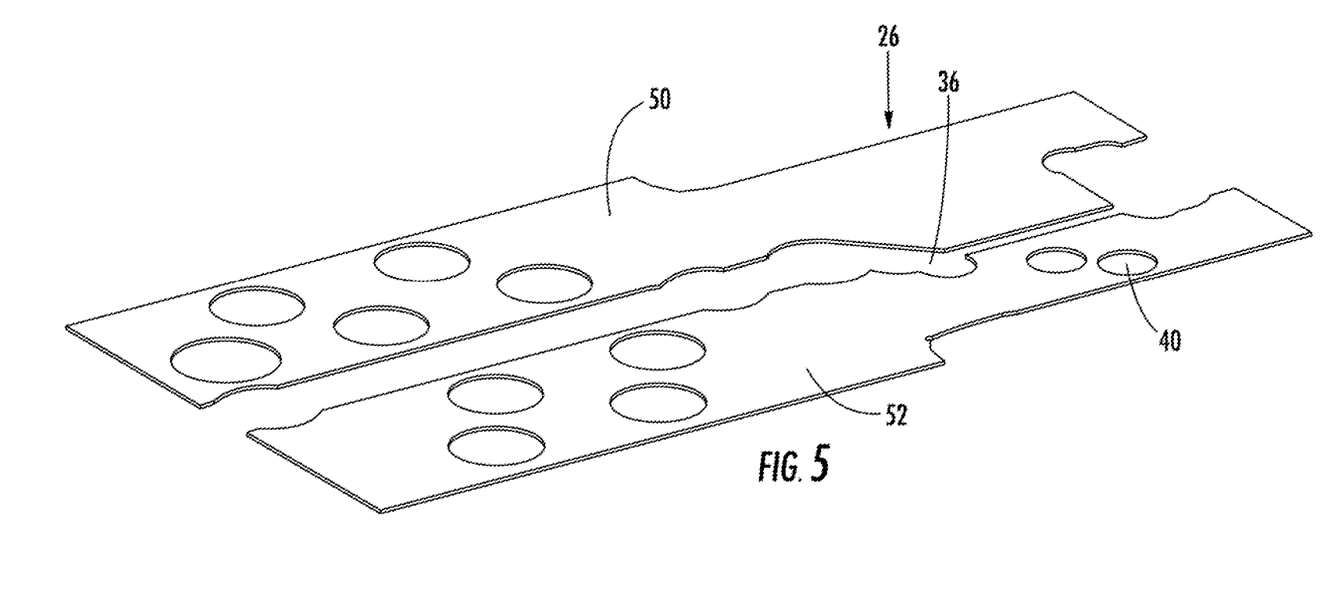
FIG. 5 is a pictorial view of one of the split ground planes of FIG. 4.
Figure 6:
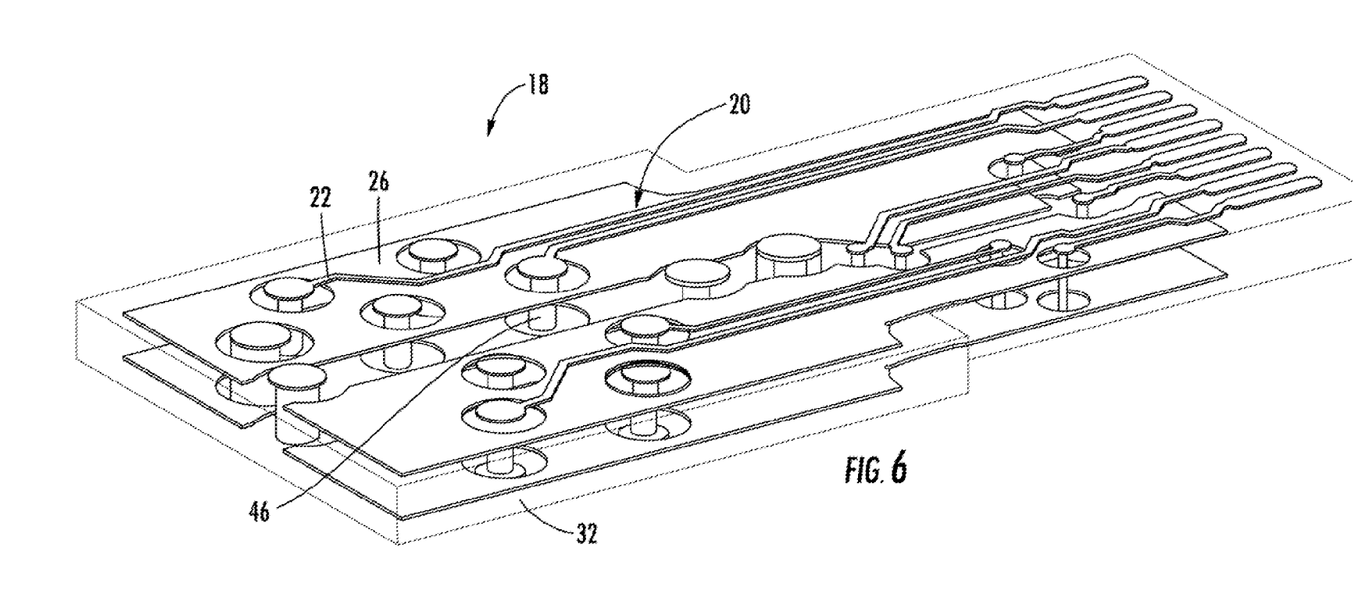
FIG. 6 is a more detailed pictorial view of the circuit board of FIG. 4.

Plug 10 also includes circuit board 18. Circuit board 18 preferably consists of seven layers of conductors and dielectric materials which is better illustrated in FIG. 3 which shows an inverted cross-section of circuit board 18. The top layer 20 of circuit board 18 includes circuit board traces corresponding to two of the four conductor pairs of traces, such as trace 22. The second layer 24 of the board 18 includes a high performance, high frequency dielectric material such as FR408 which is commercially available from Isola Laminate Systems Corp. The third layer 26 of circuit board 18 consists of a first split ground plane 26, which is also shown in FIG. 5. The fourth layer 28 of circuit board 18 consists of standard dielectric material such as FR4 also commercially available from Isola Laminate Systems Corp. The fifth layer 30 of circuit board 18 consists of a second split ground plane 30. The sixth layer 32 of circuit board 18 preferably consists of the same high performance, high frequency dielectric as second layer 24. The seventh or bottom layer 34 includes another layer of circuit board traces corresponding to the other two of the four conductor pairs of traces, such as trace 35.

As can be seen best in FIG. 5, first ground plane 26 is split forming a gap 36 extending lengthwise along the ground plane in the direction of the pairs of traces so as to effectively divide ground plane 26 into two electrically isolated elements 50 and 52. The position of the split relative to the traces affects electrical performance. Second ground plane 30 is also split and is preferably substantially identical to first ground plane 26. The traces on the top side and bottom side of circuit board 18 are terminated to circuit board contacts 38 which extend from one side of circuit board 18. For reference, the side of circuit board 18 from which the circuit board contacts 38 extend is referred to as the top side. A plurality of via holes, such as via hole 40, extend through the circuit board 18 so that a trace on the bottom side of the board can be connected to a corresponding circuit board contact. For example, trace 35 is connected to conductor 46 which extends through a via hole (not shown so conductor 46 and its connections are clear) which in turn connects to circuit board contact 48. The eight circuit board contacts 38 are connected to eight corresponding plug contacts 16.

Figure 2:
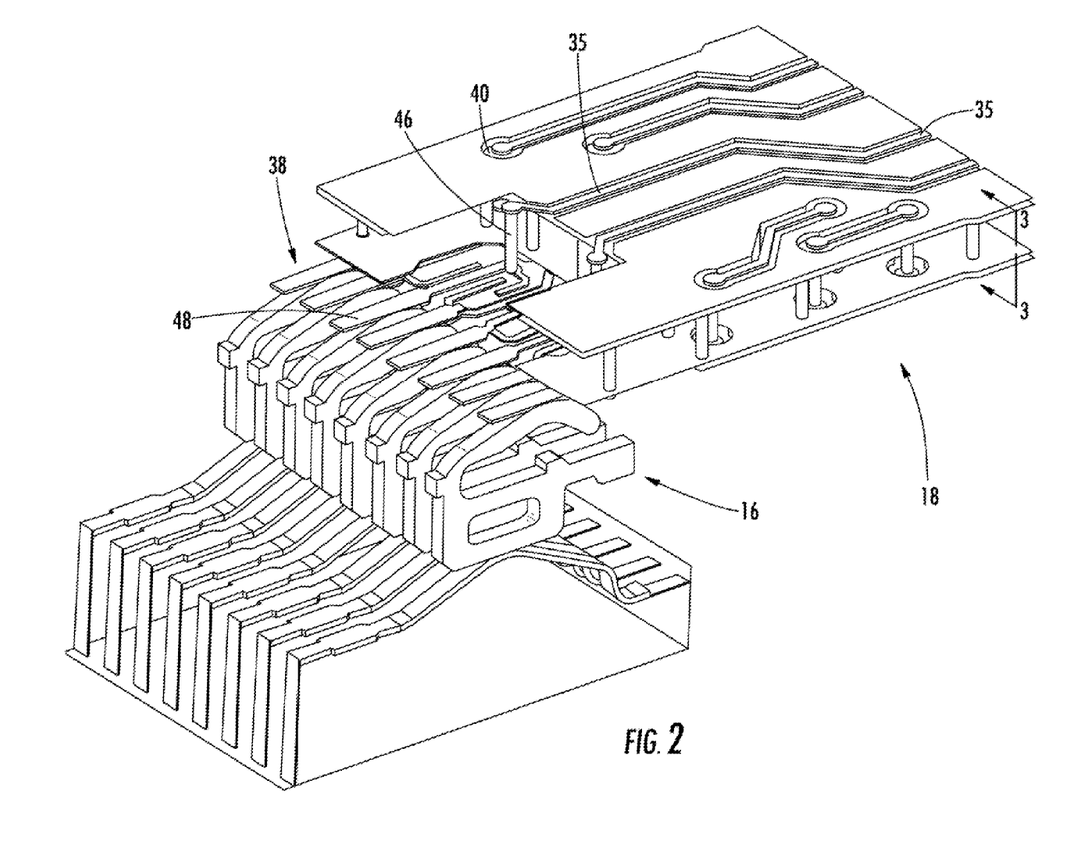
FIG. 2 is a partial pictorial view of the plug of FIG. 1 with the plug body and plastic components having been removed for exemplification purposes.

Referring again to FIG. 5, while item 26 is referred to as a ground plane, it includes at least two, and preferably two, substantially electrically isolated sections, namely, sections 50 and 52 which are separated by gap 36. By referring to sections 50 and 52 as being "substantially electrically isolated" it is meant that the two elements do not contact one another and the gap 36 is wide enough so that electrical energy is not substantially transferred across the gap 36 even at 2,000 MHz. That is, it is important that gap 36 not be so small that substantial current or voltage from section 50 could be transferred to section 52 and vice verse either by capacitive or by inductive coupling. In addition, while it is preferred that sections 50 and 52 of ground plane 26 are on the same plane as illustrated in FIG. 2, it is not intended to exclude sections which are on different planes, however, it is important that sections 50 and 52 not be in electrical contact with one another. It is preferred that the gap 36 be at least 0.08 millimeters wide. It is also preferred that gap 36 not be so wide that the return loss reduction characteristics of ground plane 26 be degraded. It is preferred that gap 36 be no wider than 6.35 millimeters.

Figure 7:
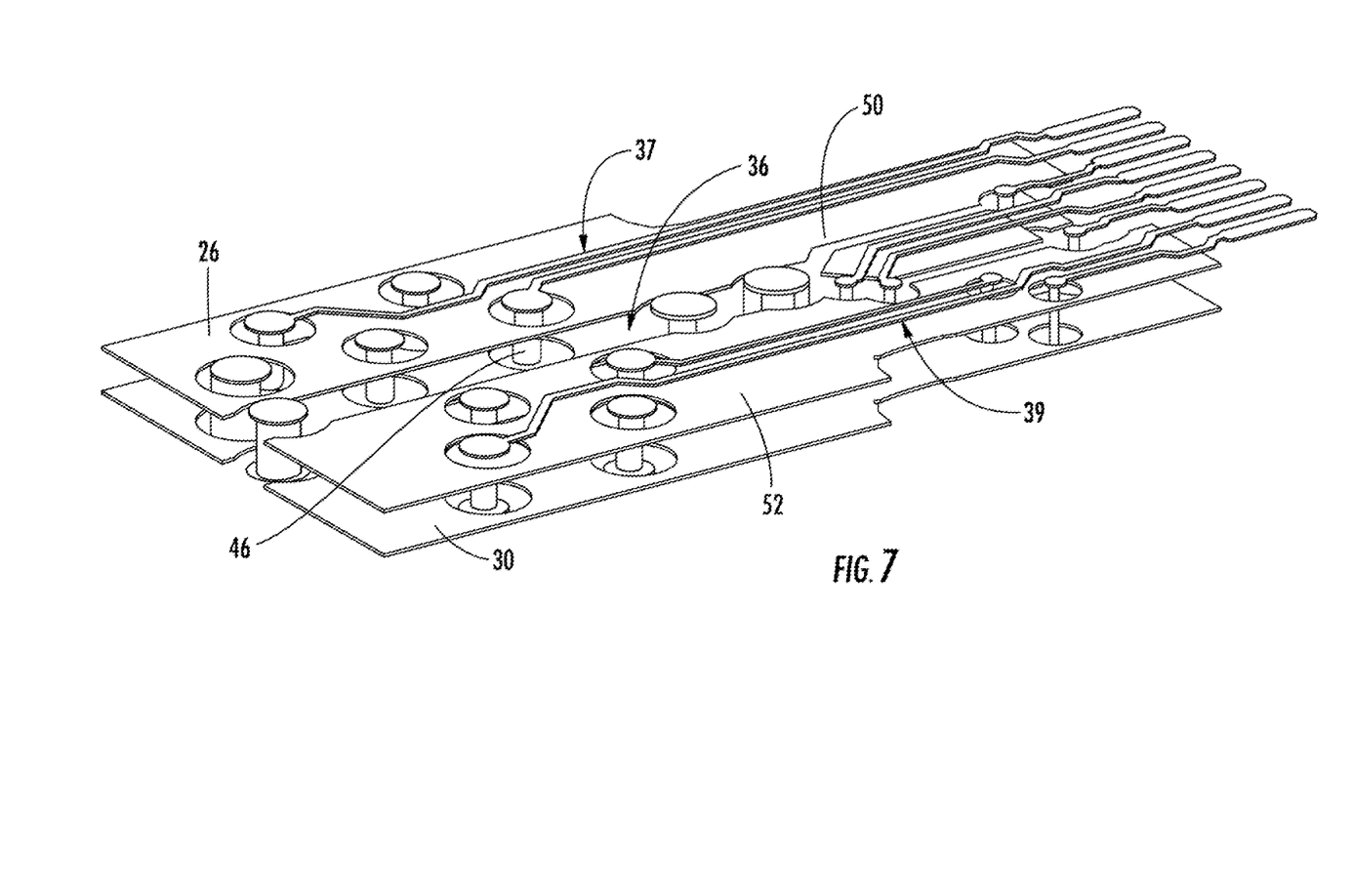
FIG. 7 is a pictorial view of the circuit board of FIG. 6, but with the dielectric materials removed showing the top of the circuit board.
Figure 8:
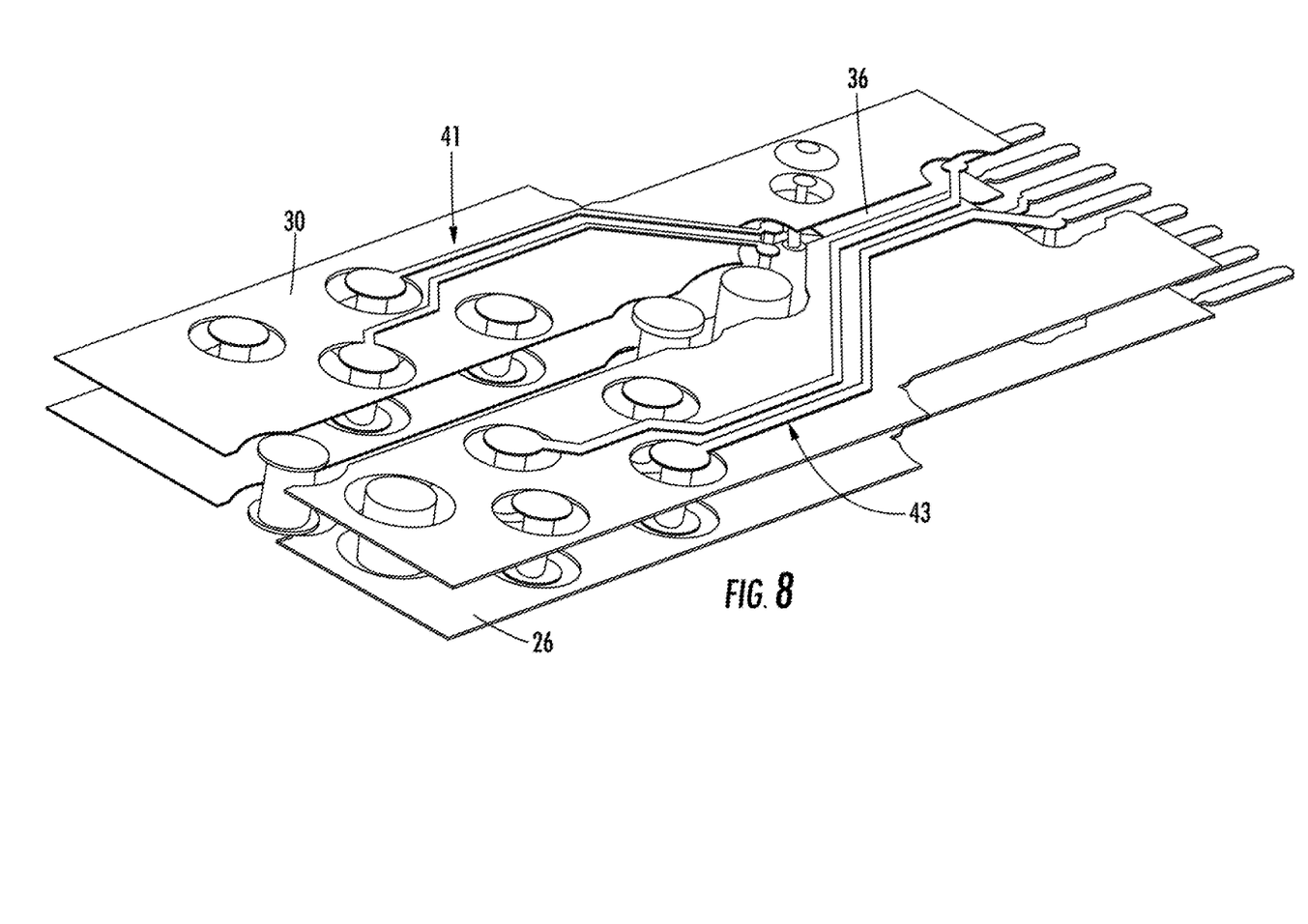
FIG. 8 is a bottom view of the circuit board of FIG. 7.

As can be seen in FIG. 7, pair 37 is above and adjacent to section 50 of split ground plane 26 and pair 39 is above and adjacent to section 52 of split ground plane 26. Any energy transferred from pair 37 to section 50 will not be transferred to section 52 or pair 39 because gap 36 electrically isolates return current of the signal on each trace to sections 50 and 52. The same electrical isolation occurs between the two split sections of ground plane 30 and pair 41 and 43 on the other side of board 18 as shown in FIG. 8. It is also possible that only one trace of pair 37 be adjacent to section 50 and only one trace of pair 39 be adjacent to section 52.

Figure 18:
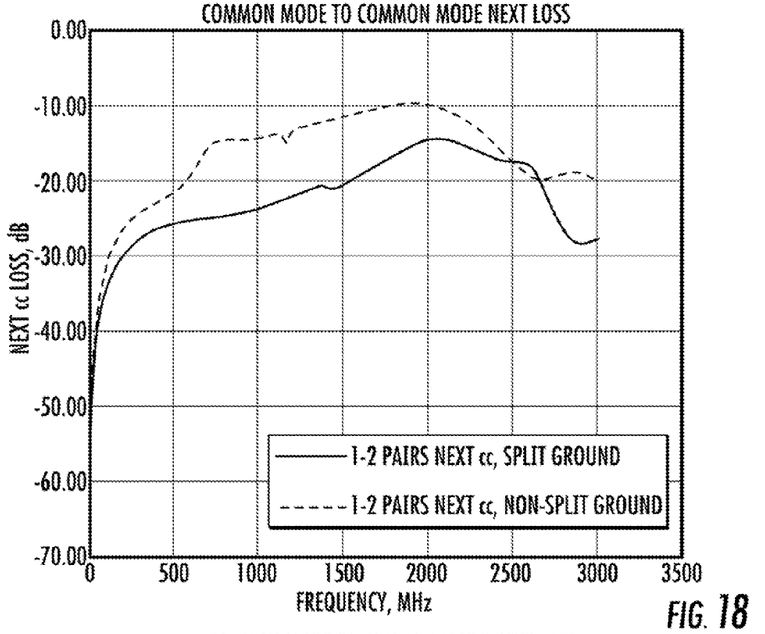
FIG. 18 is a graph showing common mode to common mode NEXT loss comparing a plug having split ground planes of the subject invention and the plug having non-split ground planes for Pairs 1-2.

It has been found that the use of a split ground plane increases common mode isolation between the traces which enhanced differential pair transmission characteristics of plug 10. This is best illustrated in reference to FIGS. 18, 19 and 20. For example, as shown in FIG. 18, a plug having a split ground plane was compared to a plug having a non-split ground plane, with all of the other elements of the plug being the same. As can be seen in FIG. 18, common mode to common mode NEXT loss for pairs 1-2 for the split ground plane achieved greater performance for a bandwidth up to 2,000 megahertz.

Figure 19:
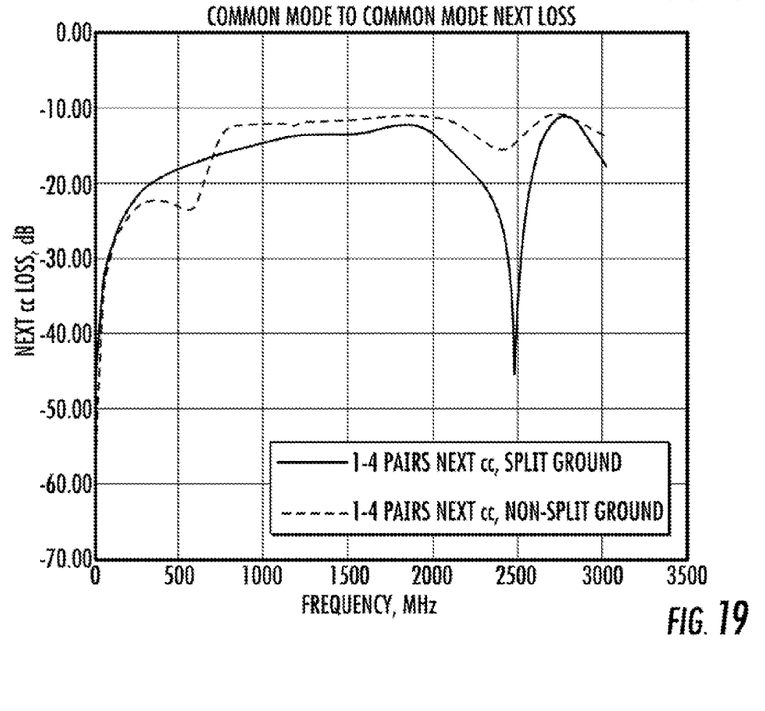
FIG. 19 is a graph showing common mode to common mode NEXT loss comparing a plug having a split ground plane of the subject invention to the plug having a non-split ground plane for Pairs 1-4.
Figure 20:
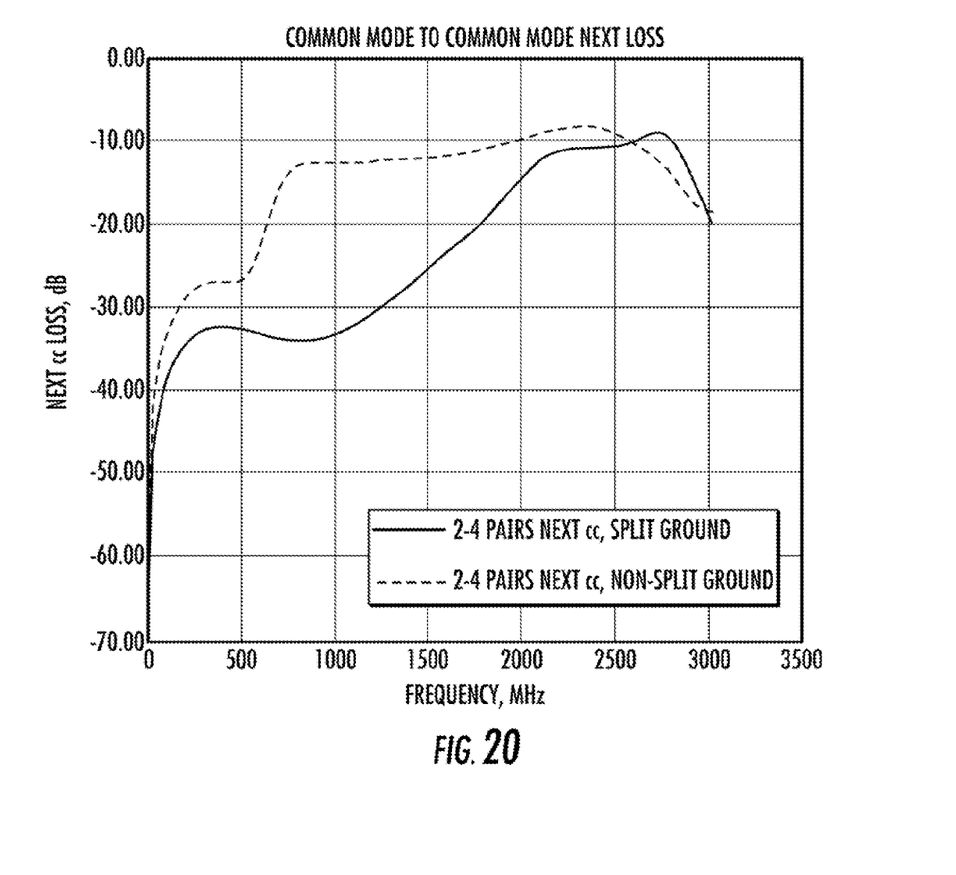
FIG. 20 is a graph showing common mode to common mode NEXT loss comparing a plug having a split ground plane of the subject invention to the plug having a non-split ground plane for Pairs 2-4.

As shown in FIG. 19, common mode to common mode NEXT loss for pairs 1-4 for a plug having a split ground plane was superior to a plug having a non-split ground place as was pairs 2-4 shown in FIG. 20.

Figure 9:
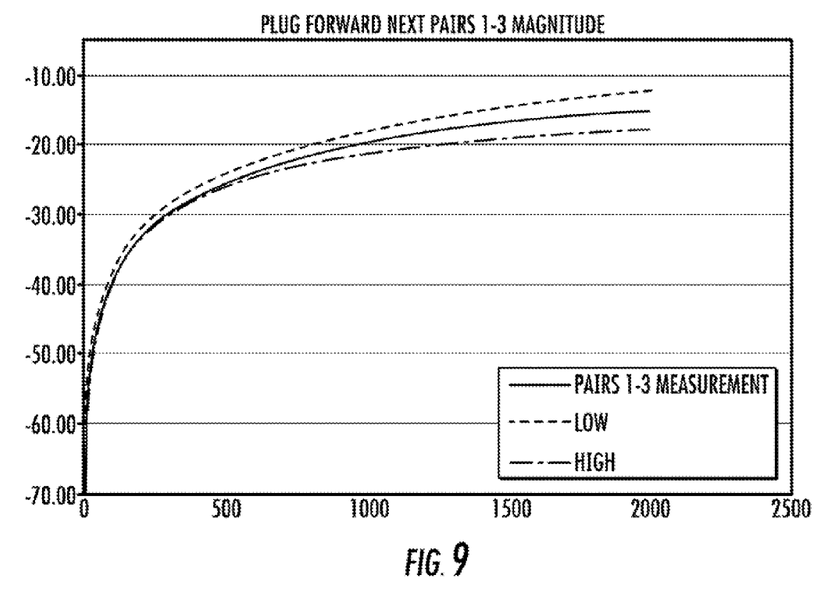
FIG. 9 is a graph showing plug forward NEXT for Pairs 1-3.
Figure 10:
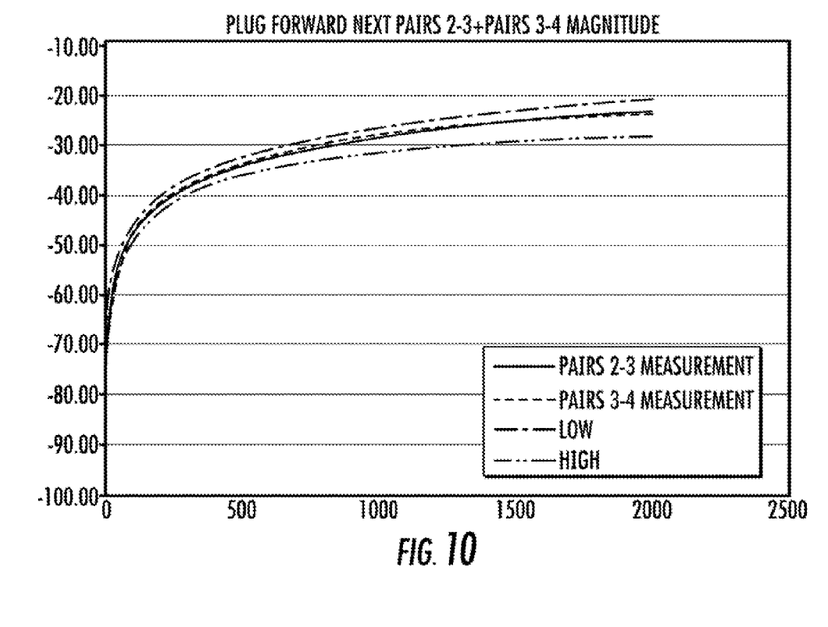
FIG. 10 is a graph showing plug forward NEXT for Pairs 2-3 and Pairs 3-4.
Figure 11:
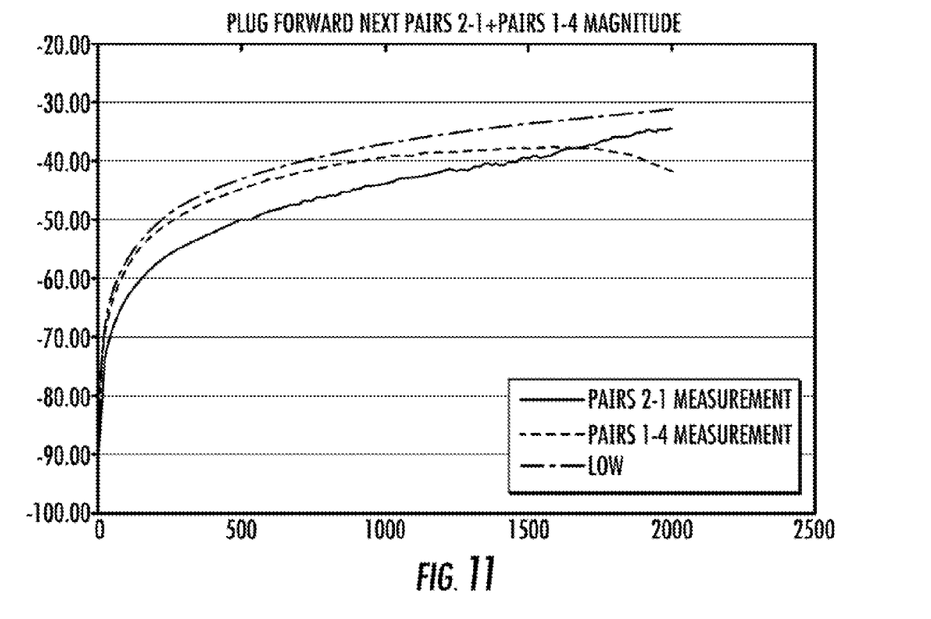
FIG. 11 is a graph showing plug forward NEXT for Pairs 2-1 and Pairs 1-4.
Figure 12:
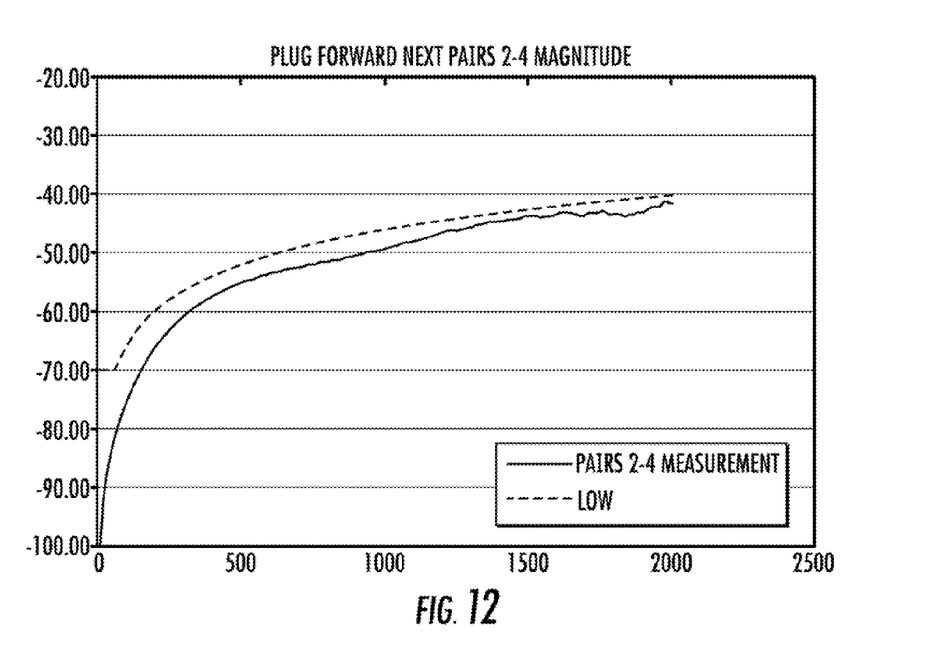
FIG. 12 is a graph showing the plug forward NEXT for Pairs 2-4.

In addition, forward NEXT for the plug of the subject invention having split ground planes 26 and 30 with the gap formed by the split being between approximately 0.45 millimeters and 1.65 millimeters has been measured. FIGS. 9 through 12 show plug forward NEXT magnitude for various pairs measured against the current Category 8 standards. FIG. 9 shows NEXT measurements for pairs 1-3. FIG. 10 shows NEXT measurements for pairs 2-3 and pairs 3-4. FIG. 11 shows NEXT measurements for pairs 1-2 and pairs 1-4. FIG. 12 shows NEXT measurements for pairs 2-4. All of the measurements shown in FIGS. 9-12 exceed the current Category 8 NEXT standard. At 2,000 MHz, the NEXT for pairs 1-3 was approximately −15.1 dB; for pairs 2-3, it was approximately −23.0 dB; for pairs 3-4, it was approximately −23.5 dB; for pairs 1-2, it was approximately −34.3 dB; for pairs 1-4, it was approximately −41.5 dB; and for pairs 2-4, it was approximately −41.4 dB.

Figure 13:
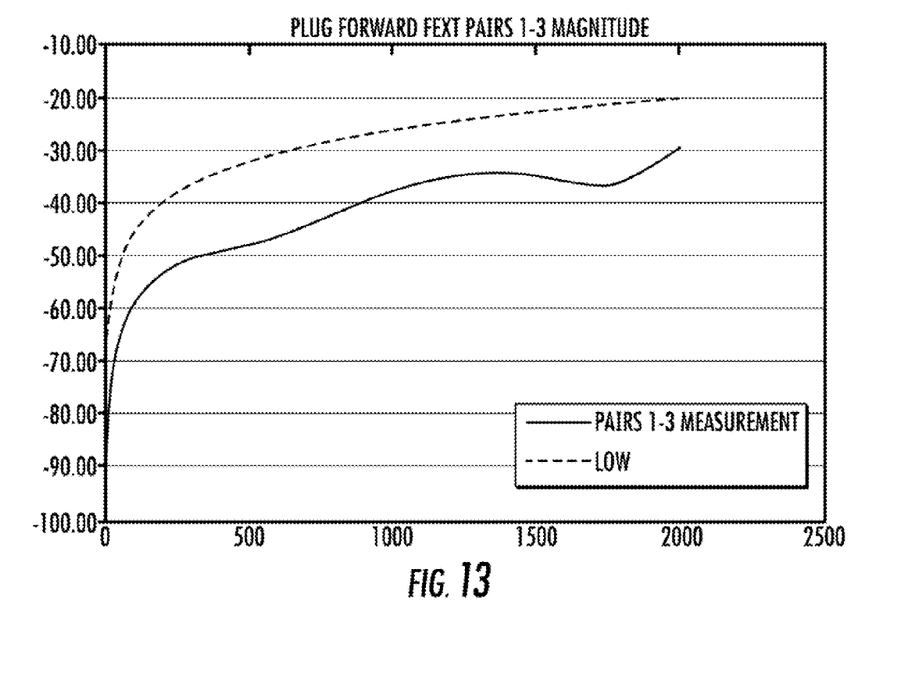
FIG. 13 is a graph showing plug forward FEXT for Pairs 1-3.
Figure 14:
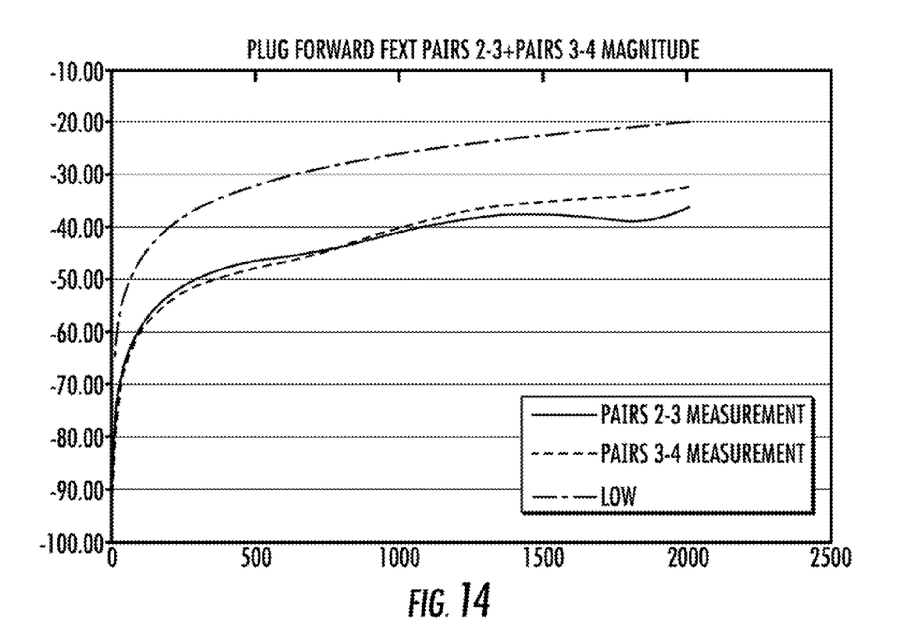
FIG. 14 is a graph of plug forward FEXT for Pairs 2-3 and Pairs 3-4.
Figure 15:
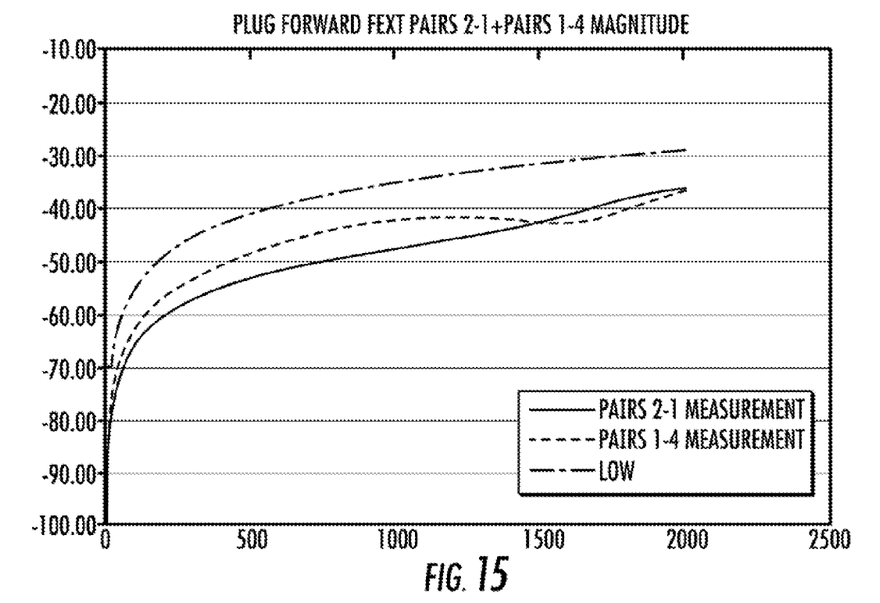
FIG. 15 is a graph showing plug forward FEXT for Pairs 2-1 and Pairs 1-4.
Figure 16:
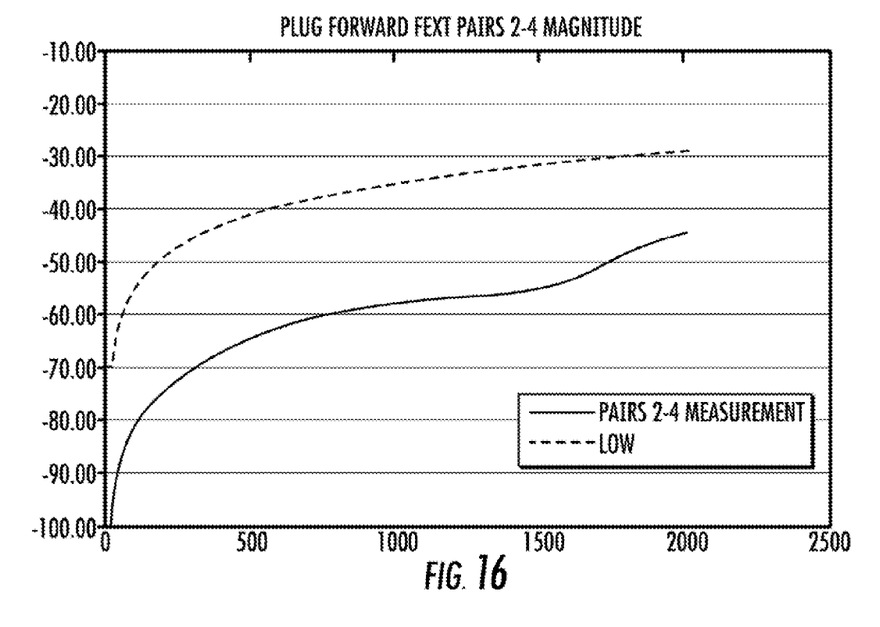
FIG. 16 is a graph showing plug forward FEXT for Pairs 2-4.

Plug forward FEXT for the same plug of the subject invention has also been measured. FIGS. 13 through 16 show plug forward FEXT for various pairs. FIG. 13 shows FEXT measurements for pairs 1-3. FIG. 14 shows FEXT measurements for pairs 2-3 and pairs 3-4. FIG. 15 shows FEXT measurements for pairs 1-2 and pairs 1-4. FIG. 16 shows FEXT measurements for pairs 2-4. All of these readings show that the plug of the subject invention exceeds the current Category 8 FEXT standard. At 2,000 MHz, the FEXT for pair 1-3 was approximately −29.3 dB; for pairs 2-3, it was approximately −36.1 dB; for pairs 3-4, it was approximately −32.3 dB; for pairs 1-2, it was approximately −36.2 dB; for pairs 1-4, it was approximately −36.7 dB; and for pairs 2-4, it was approximately −44.5 dB.

Figure 17:
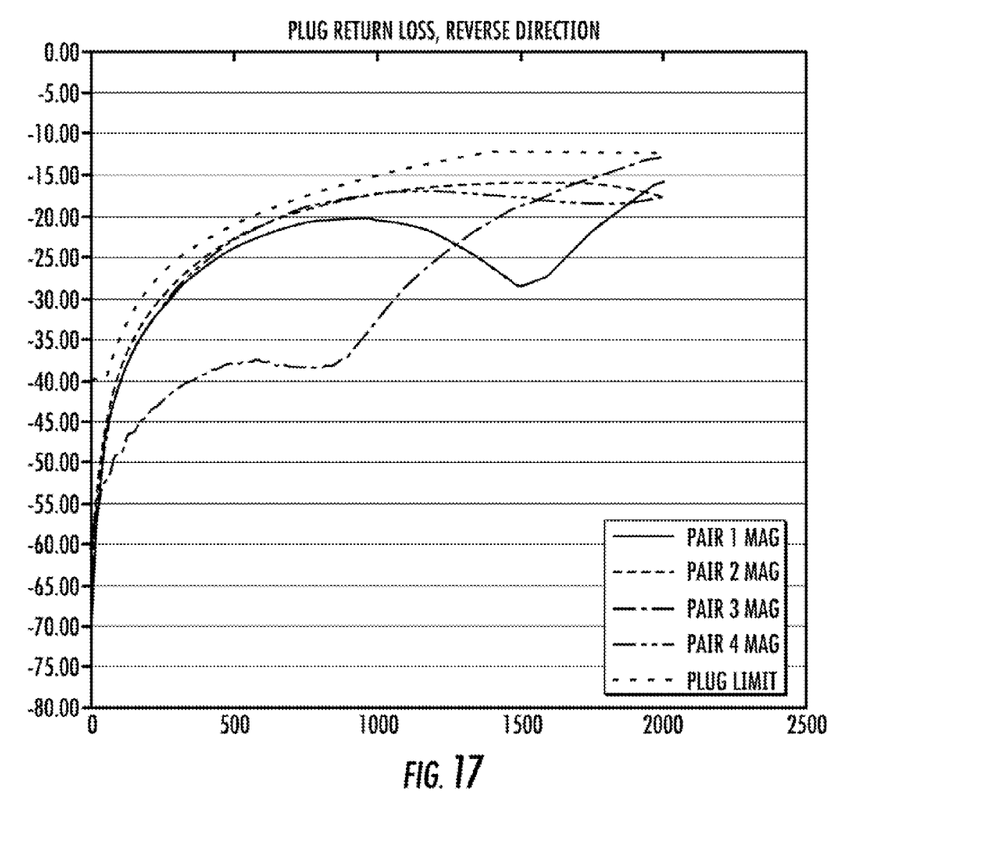
FIG. 17 is a graph showing plug return loss, reverse direction for all four pairs.

FIG. 17 shows the return loss for all four pairs for the same plug of the subject invention which also exceed the draft Category 8 standard for return loss as of Dec. 1, 2014. At 2,000 MHz, the return loss for pair 1 was approximately −15.5 dB; for pair 2, it was approximately −17.3 dB; for pair 3, it was approximately −12.5 dB; and for pair 4, it was approximately −17.3 dB.

Referring again to FIG. 3, fourth or center layer 28 of the circuit board 18 is made from an inexpensive standard dielectric material such as FR4 as the central core and is used primarily as a substrate for the circuit board. FR4 is made from woven fiberglass clothe with an epoxy resin binder and has a fairly high dielectric constant, dependent on the frequency of the signal, such as, for example, a dielectric constant of 4.5. However, the material which more directly affects the transmission qualities of the plug is the dielectric used for the second layer 24 and the sixth layer 32 of the circuit board, because those layers are in close proximity to the traces in layers 20 and 34. The dielectric second and sixth layers have a dielectric constant less than 4.5 and preferably no more than 3.7. This lower dielectric constant material is well suited to high frequency content and supports the higher frequency transmission of Category 8, i.e., up to 2,000 megahertz. It is preferred that the material in the second layer and in the sixth layer be FR408. FR408 is also made from woven fiberglass cloth with an epoxy resin binder but is designed for faster signal speeds. It has been found that the use of the FR408 as the second and sixth layers helps enable the improved differential return loss referred to above. The second and sixth FR408 layers should be thinner than the fourth FR4 layer. Preferably, the thickness of the second and sixth layers are 0.127±0.025 mm. Since FR408 is more expensive than FR4, substantial cost benefits are achieved by using only thin layers of FR408 without degrading signal quality. The thickness of the FR408 could be any standard available size. The PCB referred to herein uses 0.005 inch layers. The thickness is driven by the desired trace geometry.

The use of a ground plane in an RJ45 plug improves return loss. However, Applicant has found that without the use of split or gap 36 in ground plane 26, cross talk with respect to the conductor pairs becomes a problem. The split in the ground plane forces return currents of the transmission lines to remain in proximity to the transmission lines, resulting in increased common mode isolation between traces of plug and thus reduced cross talk. Preferably, the thickness of ground plane 26 is in the range of 0.0178 millimeters to 0.0771 millimeters. In addition, it is preferred that ground plane 26 be made of copper. It is also preferred that the distance between traces on one side of circuit board 18 and its adjacent ground plane 26 be between 0.051 millimeters and 0.61 millimeters. The use of the term split ground plane as used herein can also mean two or more separate ground planes. The separate ground planes or separate sections of a split ground plane may or may not be at the same potential. It has been found that placement of the split ground plane below pairs of traces as defined in the connector PCB allows tuning of coupling parameters between other pairs and individual conductors in the overall plug.

Referring to the foregoing description of the preferred embodiments of the invention, it would be apparent that many modifications may be made therein. It is to be understood that all such modifications are embodied in the accompanying claims which come within the true spirit and scope of the invention.

The invention claimed is:

1. A communication connector comprising:
a housing;
a plurality of pairs of electrical contacts received by the housing;
a printed circuit board (PCB); the PCB including at least first and second pairs of electrical conductive signal traces; the first pair of traces connected to a first pair of contacts; the second pair of traces connected to a second pair of contacts; the PCB having first and second regions; the first pair of traces located in the first region and the second pair of traces located in the second region; the PCB further including at least a first ground plane; the first ground plane having first and second sections; the first and second sections being substantially electrically isolated from one another; at least a portion of the first section being adjacent to at least a portion of the first pair of traces; at least a portion of the second section being adjacent to at least a portion of the second pair of traces whereby a signal transmission performance is improved.

2. A communication connector as set forth in claim 1 wherein the first and second sections are spaced apart.

3. A communication connector as set forth in claim 2 wherein the space between the first and second sections is at least 0.08 millimeters.

4. A communication connector as set forth in claim 3 wherein the space between the first and second sections is no more than 6.35 millimeters.

5. A communication connector as set forth in claim 1 wherein the PCB includes a first dielectric material located between one side of the ground plane and the first and second pairs; the first dielectric material having a dielectric constant less than 4.5.

6. A communication connector as set forth in claim 5 further including a second dielectric material located adjacent to the other side of the ground plane; the second dielectric material having a dielectric constant of at least 4.5.

7. A communication connector as set forth in claim 5 wherein the thickness of the first dielectric material is no more than 0.127 millimeters.

8. A communication connector comprising:
a housing;
a plurality of pairs of electrical contacts received by the housing;
a first printed circuit board (PCB); the PCB including at least first and second pairs of electrically conductive signal traces; the first pair of traces connected to a first pair of contacts; the second pair of traces connected to a second pair of contacts; the PCB having first and second regions; at least one trace of the first pair of traces located in the first region and at least one trace of the second pair of traces located in the second region; the PCB further including at least a first conductive ground plane; the first conductive ground plane having a gap thereby forming first and second sections which are not electrically connected to each other; at least a portion of the first section being adjacent to at least a portion of at least one trace of the first pair; at least a portion of the second section being adjacent to at least a portion of at least one trace of the second pair.

9. A communication connector as set forth in claim 8 wherein the gap is between 0.45 millimeters and 1.65 millimeters wide.

10. A communication connector as set forth in claim 8 further including a second ground plane; the second ground plane having third and fourth sections; the first and second pairs located on one side of the PCB; the third and fourth pairs located on the other side of the PCB; the third and fourth sections of the second ground plane not electrically connected to one another; a portion of the third section being adjacent to a portion of the third pair; a portion of the fourth section being adjacent to a portion of the fourth pair.

11. A communication connector as set forth in claim 10 wherein the PCB includes seven layers; the first and second pairs being the first layer; the first ground plane being the third layer, the second ground plane being the fifth layer; the third and fourth pairs being the seventh layer; a dielectric material forming second and sixth layers; the first dielectric material being a high frequency material having a relatively low dielectric constant; a second dielectric material forming the fourth layer; the second dielectric material having a dielectric constant greater than the dielectric constant of the first dielectric material.

12. A communication connector as set forth in claim 11 wherein the thickness of the second and sixth layers are between 0.102 millimeters and 0.152 millimeters.

13. A communication connector as set forth in claim 11 wherein the dielectric constant of the first dielectric material is less than 4.5.

14. A communication connector as set forth in claim 8 wherein the gap is at least 0.08 millimeters wide.

15. A communication connector as set forth in claim 8 wherein the first and second sections of the first ground plane are each on the same plane.

16. A communication connector comprising:
a housing;
a plurality of pairs of electrical contacts received by the housing;
a printed circuit board (PCB); the PCB including at least first and second pairs of electrical conductive signal traces; the first pair of signal traces connected to a first pair of contacts and the second pair of signal traces connected to a second pair of contacts; the PCB further including a first ground plane, a layer of relatively high dielectric material, and a layer of relatively low dielectric material supporting high frequency transmissions; the layer of relatively low dielectric material being located between one side of the first ground plane and the first and second pairs of traces; the layer of relatively high dielectric material being adjacent to the other side of the first ground plane.

17. A communication connector as set forth in claim 16 wherein the dielectric constant of the relatively low dielectric material being less than 4.5.

18. A communication connector as set forth in claim 17 wherein the dielectric constant of the material having a relatively low dielectric constant is approximately 3.7 or less.

19. A communication connector as set forth in claim 16 wherein the PCB includes seven layers; the first and second pairs being the first layer; the first ground plane being the third layer; the second ground plane being the fifth layer; the third and fourth pairs being the seventh layer; a first dielectric material forming second and sixth layers; the first dielectric material being a high frequency material having a relatively low dielectric constant; a second dielectric material forming the fourth layer; the second dielectric material having a dielectric constant greater than the dielectric constant of the first dielectric material.

20. A communication connector as set forth in claim 19 wherein the thickness of the second and sixth layers are between 0.102 millimeters and 0.152 millimeters.

* * * * *